(12) United States Patent
Sarda

(10) Patent No.: US 10,075,173 B2
(45) Date of Patent: Sep. 11, 2018

(54) DIGITAL FAST LOCK FOR PHASE-LOCKED LOOPS

(71) Applicant: Silicon Laboratories Inc., Austin, TX (US)

(72) Inventor: Vivek Sarda, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/358,898

(22) Filed: Nov. 22, 2016

(65) Prior Publication Data

US 2018/0145696 A1  May 24, 2018

(51) Int. Cl.

| H03L 7/089 | (2006.01) |
|---|---|
| H04L 7/00 | (2006.01) |
| H03L 7/093 | (2006.01) |
| H03L 7/099 | (2006.01) |
| H03L 7/08 | (2006.01) |
| H03L 7/081 | (2006.01) |
| G01R 23/02 | (2006.01) |

(52) U.S. Cl.
CPC .............. *H03L 7/093* (2013.01); *G01R 23/02* (2013.01); *H03L 7/081* (2013.01); *H03L 7/0802* (2013.01); *H03L 7/0992* (2013.01)

(58) Field of Classification Search
CPC ....... H03L 7/093; H03L 7/081; H03L 7/0992; H03L 7/0802; G01R 23/02
See application file for complete search history.

(56) References Cited

U.S. PATENT DOCUMENTS

| 6,064,947 A * | 5/2000 | Sun | G11B 20/1403 331/187 |
|---|---|---|---|
| 6,597,249 B2 * | 7/2003 | Chien | H03L 7/099 327/147 |
| 6,714,772 B2 * | 3/2004 | Kasahara | H03L 7/0891 327/156 |
| 7,154,344 B2 * | 12/2006 | Thies | H03L 7/095 331/16 |
| 8,536,910 B2 * | 9/2013 | Nagaraj | H03L 7/0891 327/147 |

* cited by examiner

*Primary Examiner* — Kenneth B Wells
(74) *Attorney, Agent, or Firm* — Zagorin Cave LP

(57) ABSTRACT

A phase-locked loop uses an edge detect circuit to detect an edge of an input clock signal. The detected edge is used to digitally align an initial edge of the feedback signal with the input clock signal to the PLL so that the feedback signal is substantially aligned with the input clock signal. The edge alignment of the feedback signal may be performed at startup or in response to loss of lock/input clock switching. By aligning the feedback signal the input clock signal based on the edge detect, faster lock occurs.

20 Claims, 4 Drawing Sheets

DIGITAL FAST LOCK FOR PHASE-LOCKED LOOPS

BACKGROUND

Field of the Invention

This invention relates to phase-locked loops and more particularly to locking a feedback signal to an input signal.

Description of the Related Art

FIG. 1 shows a typical phase-locked loop (PLL) 100 in which an input clock signal 103 is compared to a feedback signal 105 in phase frequency detector (PFD) and charge pump 107. The PFD supplies the phase/frequency information containing the difference between the input clock signal 103 and the feedback signal 105 to the charge pump, which in turn supplies the loop filter 111. The loop filter controls the voltage controlled oscillator (VCO) 115, which supplies the output clock signal 117. A feedback divider 119 divides the output clock signal 117 based on a divide control signal 121 and supplies the feedback signal 105. The VCO 115 is controlled to lock the feedback signal 105 to the phase and frequency of the input clock signal 103 based on the output of the PFD and charge pump 107.

The locking time for the PLL can be very large for low frequency inputs. Typically, the loop bandwidth of the PLL is less than the frequency of the input clock signal. For example, for an input clock signal of one pulse per second (1 PPS) the loop bandwidth may be in the milliHz range. For such a loop bandwidth, the locking time can be hours or days when the difference between the input clock signal and the feedback signal at startup may be up to, e.g., ±a half second.

Such large differences at startup require circuits that can handle representing the large differences. Thus, such circuits have large full scale requirements, where full scale corresponds to the expected maximum difference between the input signals. Phase frequency detector (PFD) offsets are large when designed for a wide range of inputs due to large full scale requirements. The large full scale requirements result in the possibility that the different circuit paths for each input have circuit differences due to process variations resulting in offsets present between the two paths. For example, the different paths may have different resistance and capacitances due to process variations that can increase under certain temperature conditions. On the other hand, if the full scale requirements are not met, clipping results in a non-linear response in the PFD. To avoid clipping however, meeting large full scale requirements can result in large offsets and thus inaccuracy in the measurement of the differences between the two input signals to the PFD.

Some PLLs have multiple input clocks that can be selected so that the PLL can switch between input clock signals when one of the input clocks fails or when a switch from one reference frequency to another reference frequency is desired. When a loss of signal for one of the input clocks occurs resulting in a loss of lock (LOL) indication, or a manual switch occurs, conventional switching approaches require long digital capture and computation cycles to evaluate the new clock signal and adjust the PLL output. That is, the new input clock is observed for a long time to determine how the new input clock compares to the old input clock and in the meantime, the oscillator output is typically frozen as the new input clock signal is evaluated. That long evaluation time can be particularly true for a low frequency input clock signal. Waiting to lock to the new input signal can be detrimental to the system as errors in the currently frozen output clock signal from the PLL may be present until the PLL is able to lock to the new input clock signal.

In addition, very low bandwidth filters, e.g., in the milliHz range, may be disrupted by large phase/frequency corrections. For example, large phase/frequency corrections expose low latency IIR filters to instability at their full scale.

Accordingly, improvements in PLLs is desirable to address at least some of the issues described above.

SUMMARY OF EMBODIMENTS OF THE INVENTION

In one embodiment, a method for operating a phase-locked loop includes detecting an edge of an input clock signal to a phase and frequency detector (PFD) of a phase-locked loop in an edge detect circuit and generating an edge detect signal based thereon. The method further includes adjusting an edge of a feedback signal in the feedback divider based on the edge detect signal so the edge of the feedback signal is substantially aligned with the input clock signal. The feedback signal is supplied to the PFD, the feedback signal being substantially aligned with the input clock signal after the adjusting.

In another embodiment, a phase-locked loop includes a phase and frequency detect circuit coupled to supply a difference between an input clock signal and a feedback signal. An edge detect circuit receives the input clock signal and supplies an edge detect indication responsive to detecting an edge of the input clock signal. A feedback divider and associated control logic is responsive to the edge detect indication to delay supplying of the feedback signal so that the feedback signal is substantially aligned with the input clock signal when supplied.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein address the long lock time for PLLs especially for PLLs with a low frequency input clock and/or for PLLs having a very low loop bandwidth. Embodiments described herein reduce variation in input/output (I/O) delay by reducing the need for a large full scale range for the PFD. I/O delay is the difference between the clock signal along the feedback path (from the VCO to the PFD) and the clock signal along the output path (VCO to output). The input to output offset may be a concern in jitter cleaning clock applications or if there is an integer relationship between the inputs and outputs. For unrelated inputs and outputs such as fractional-N PLLs, I/O delay may not be an issue. Embodiments also provide much faster lock times that are more predictable and can lower power and area and provide improved overall system performance during PLL lock.

Figure 1:
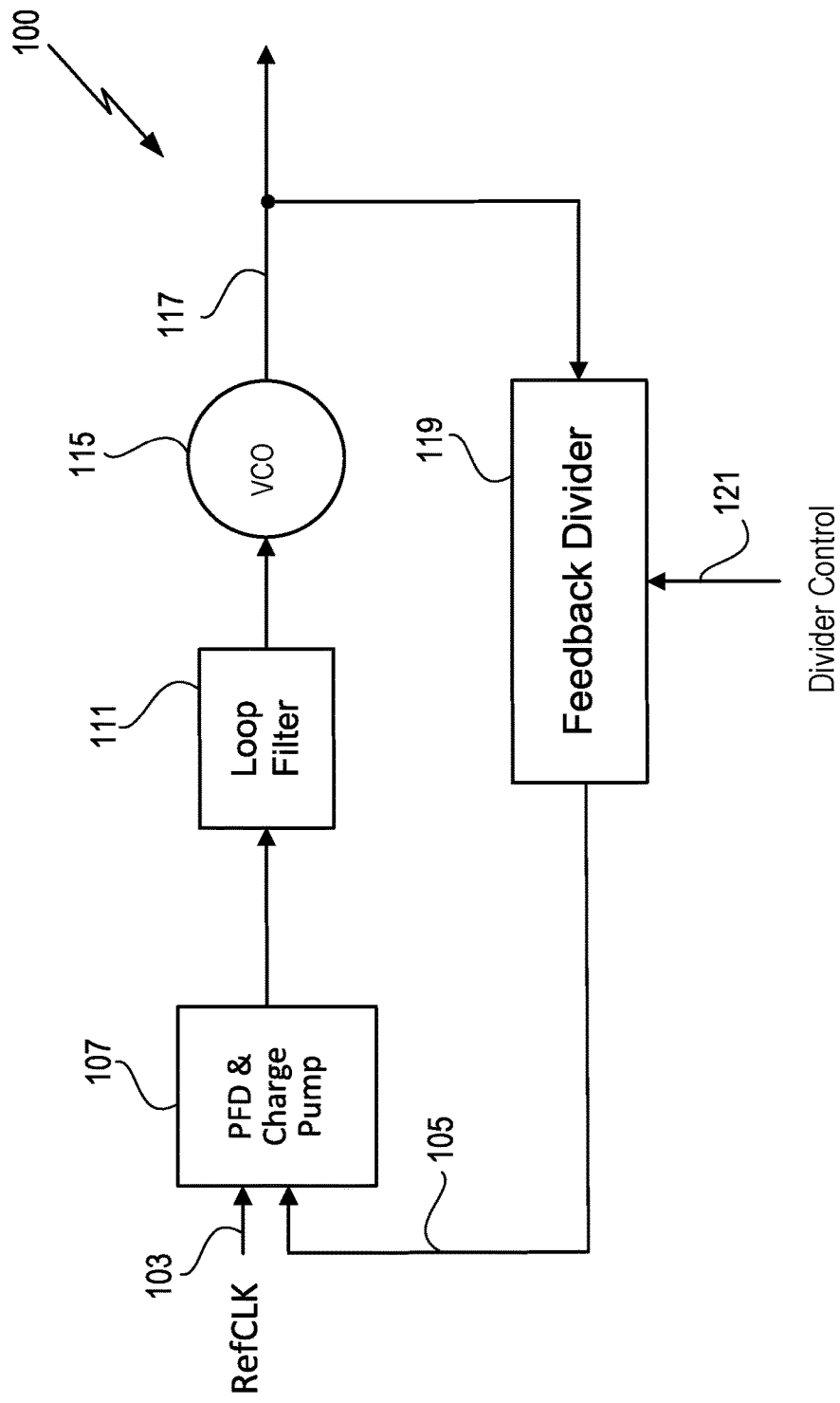
FIG. 1 shows a prior art PLL.
Figure 2:
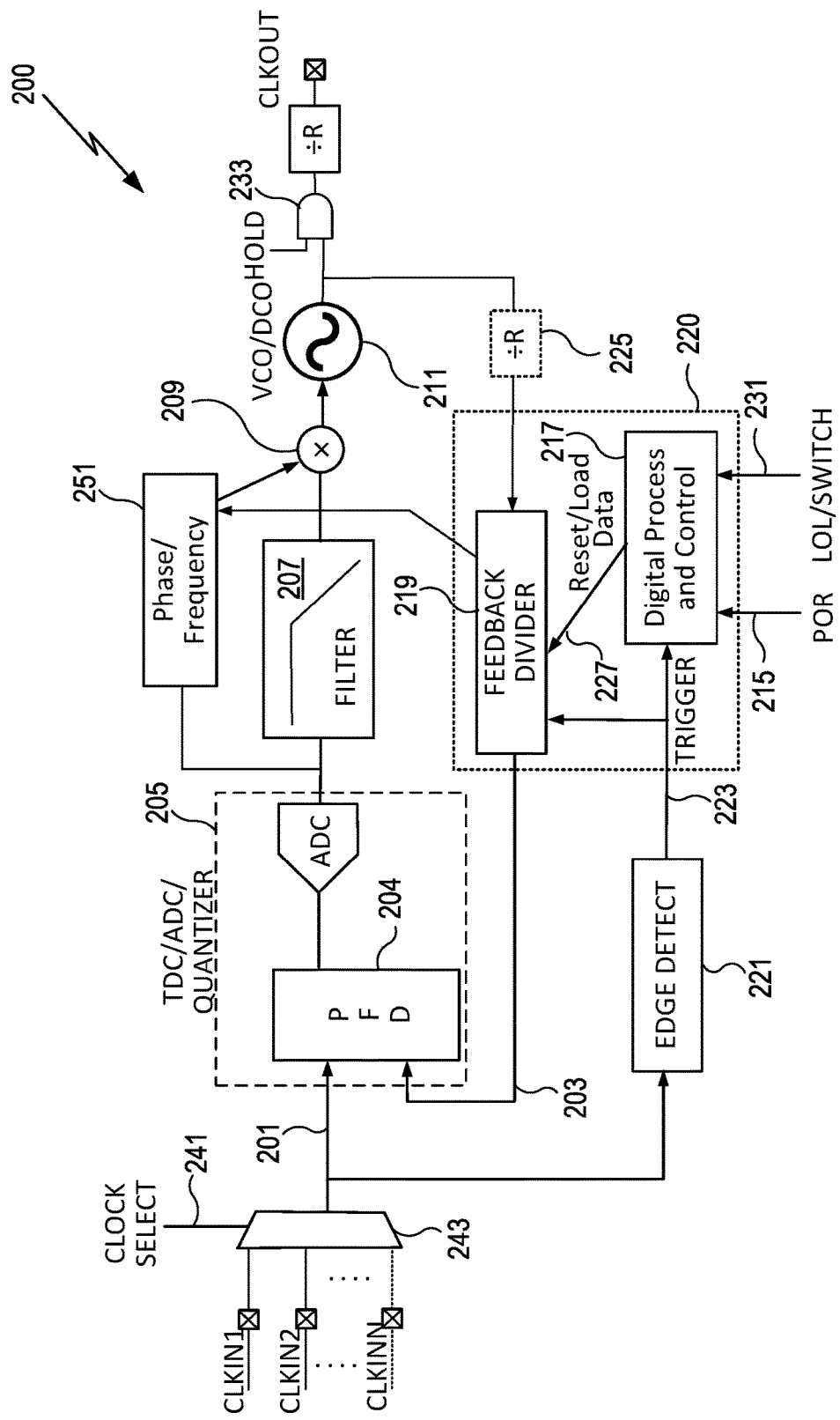
FIG. 2 shows a PLL according to an embodiment of the present invention.

Referring to FIG. 2, PLL 200 uses information from the edge of the input clock signal 201 to align the edge of the feedback signal 203 with the edge of the input clock signal 201 to thereby align the input clock signal with the feedback signal at the start of the feedback signal. The PLL 200 includes conventional PLL blocks including the PFD 204 that forms part of the time to digital converter TDC/analog to digital converter (ADC)/quantizer block 205. The TDC/ADC/quantizer block 205 may be implemented in various embodiments as a digital block, analog block, or mixed analog and digital. The various embodiments of block 205 provide the phase/frequency difference between input clock signal 201 and feedback signal 203 to loop filter 207. The loop filter in turn supplies a control value through arithmetic circuit 209 (described further herein) to the controlled oscillator 211. Other embodiments may omit arithmetic circuit 209 and/or replace it with an analog equivalent. The oscillator 211 may be a VCO, a digitally controlled oscillator (DCO), or any appropriate oscillator that can be used in the PLL 200. The oscillator is coupled to the feedback divider through an optional divider 225.

Upon startup of the PLL 200, a reset signal such as power on reset (POR) signal 215 is supplied to digital process and control logic 217. The reset signal may be supplied to additional logic in PLL 200 such as the feedback divider 219, the edge detect circuit 221 and other circuits in PLL 200 but is shown being supplied to only digital process and control logic 217 for ease of illustration. When the POR signal is asserted or shortly thereafter, and when the input clock signal 201 becomes active and is being supplied to PFD 204, the control logic 217 maintains feedback divider 219 in a reset condition. The control logic 217 releases the feedback divider 219 out of reset when the feedback divider is ready to issue a feedback signal having an initial edge that is substantially aligned with the edge of the input clock signal 201.

Figure 3:
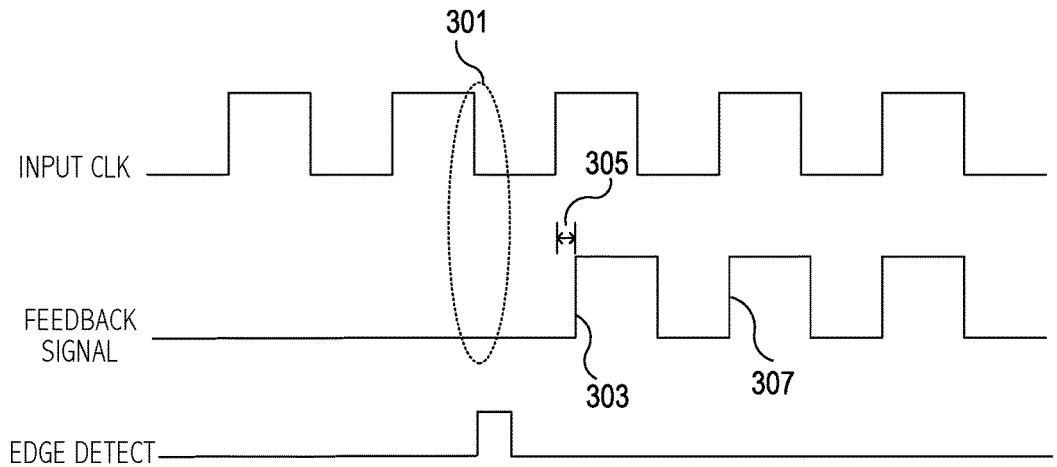
FIG. 3 shows a timing diagram associated with an embodiment of the present invention.

That alignment may occur as follows. Referring to FIGS. 2 and 3, a POR signal has been received and the edge detect circuit detects the falling edge 301 of the input clock signal 201. Until that time, the feedback signal supplied to the PFD is maintained at a steady state value, e.g., zero. The edge detect circuit 221 supplies an edge detect indication as trigger signal 223 that may be supplied both to the feedback divider 219 and the digital process and control logic 217. In response to the trigger signal 223, the feedback divider loads a divider value such that the feedback signal to be supplied has an edge that is aligned with an edge of the input clock signal. The digital process and control logic 217 may control the loading of the feedback divider and the value loaded into the feedback divider. The control logic may include, e.g., a state machine that is responsive to the reset signal to hold the feedback signal low, wait for the trigger signal, then loads the feedback divider with a divide value. In an embodiment, the feedback divider 219 counts the divider value down to zero (or counts up from zero to the divider value) and when the count value is reached, issues the feedback signal with a rising edge at 303 that is substantially aligned with the input clock signal.

The divide value to be loaded to align the start of the feedback signal with the input clock signal may be determined in multiple ways. Good estimates of the frequency of the input clock signal 201 and the output signal from oscillator 211 may be known so the value to be loaded into the feedback divider may be known or readily determined in the digital process and control logic 217. If the input clock has 50 percent duty cycle, and the falling edge is detected at 301, the divider value should represent the number of oscillator output clock signals (possibly divided down in divider 225) to correspond to a half a period of input clock signal 201. Note that the frequency of the oscillator output signal is many orders of magnitude faster than the frequency of the input clock signal 201. For example, the oscillator 211 may provide an oscillator output signal of 2.5 GHz, while the input clock signal 201 may be, e.g., 1 Hz or in the kHz range. The feedback divider may be reset and loaded with that half period divider value in response to the edge detect at 301. Other embodiments may detect rising edges rather than falling edges and may have other than fifty percent duty cycles.

In other embodiments, rather than the divider value being known, the divider value to be loaded into the feedback divider may be determined by counting the number of oscillator clocks between rising and falling edges of the input clock signal or two falling or rising edges. The control logic 217 may control the counting. In addition, while not shown, there may be separate triggers for rising and falling edges supplied from edge detect circuit 221. For a non-fifty percent duty cycle, the difference between rising and falling edges and falling and rising edges may be separately determined by the digital process and control logic 217 or already known. Once the divider value is determined, a next trigger signal from the edge detect circuit 221 can be used to align the feedback signal with the input clock signal.

However the proper divide value is determined, the feedback divider is reset and loaded responsive to the edge detect at 301 and begins counting to determine when to start the feedback signal. In the example shown in FIG. 3, after the expiration of the time counted by feedback divider 219, the feedback divider releases the feedback signal with a rising edge at 303. With the first feedback signal, the edge of the feedback signal is substantially aligned with the input clock signal 201.

The feedback divider 219 may be loaded over signal lines 227 with a divider value corresponding to a half period of the input clock signal from storage in the digital process and control logic 217. If the duty cycle is other than fifty percent, the divider may be configured, in manners well known in the art, to issue a feedback signal with an appropriate duty cycle. While the feedback divider 219 and digital process and control logic 217 are shown as separate blocks, the combined functionality is referred to herein as the feedback divider circuit 220.

There may be inaccuracy in the estimate of the divider value, due, e.g., to a discrepancy between the assumed frequency of the input clock signal and the actual frequency of the input clock signal and/or the assumed frequency of the oscillator output signal and the actual frequency of the oscillator output signal and jitter on the incoming signal. In addition, inaccuracies may arise due to circuit operation such as circuit delays involved, e.g., in detecting the edges, propagating the trigger signal(s), and loading the feedback divider with an appropriate divide value. Therefore, the initial edge of the feedback signal may not be perfectly aligned with the input signal. The misalignment is represented in FIG. 3 where the rising edge of the feedback signal differs from the input clock signal by an amount 305 after the initial edge adjustment. That difference may be, e.g., 100 parts per million in one embodiment. In other embodiments, the difference may be greater or less. That difference may gradually be reduced by operation of the PLL. In the example shown in FIG. 3, a smaller difference exists at edge 307. That difference may slowly be made smaller with a very low bandwidth PLL. In other embodiments, the bandwidth of the PLL may be adjusted initially to be a higher bandwidth to provide a faster lock and then adjust back down to a lower bandwidth. In either case, because the input clock signal and the feedback signal are already close, although not perfectly aligned, the time to lock is much faster as would be the case without the initial adjustment of the feedback signal.

As used herein substantial alignment means at least within 0.01% of the period of the input clock signal for at least some embodiments. The alignment may be much better. Reducing the difference to 0.01% or less at startup is a significant improvement over the potential half a second of difference that is possible in a PLL that locks the input clock signal and the feedback signal in a more traditional way for a 1 PPS input clock signal. In one embodiment, substantially aligned means that the input clock signal and the feedback clock signal are aligned except for the artifacts referred to in the paragraph above that cause the signals to be different than expected. For a 1 pps embodiment, substantial alignment may be, e.g., a 0.01% difference with a 10 ns jitter specification.

In addition, the feedback divider circuit 220 and the edge detect circuit 221 may continue to be used to detect the difference between edges of the input clock signal and the feedback signal. The edge of the feedback signal for the next rising (or falling edge) may be reduced or increased by the measured difference. The feedback divider edge may continue to be adjusted based on the edge detect circuit 221 for N cycles where N may be derived from the loop bandwidth, where the lower the loop bandwidth, the higher the value of N. The adjustment may skip cycles, e.g., adjust the edge every other cycle or every five cycles, or some other appropriate number of cycles, to give the loop filter time to operate and narrow the difference the frequency/phase difference between the input clock signal and the feedback signal. By using the edge detect correction to fix the feedback divider for N cycles full scale requirements can be reduced. Assume the bandwidth of the PLL is very low. That means that moving the oscillator output signal to achieve lock may take a long time. During that locking period, the error between the feedback signal and the input clock signal may accumulate and grow faster than the low loop bandwidth can handle. Thus, periodically reducing the difference between the input clock signal and the feedback signal using edge adjustments as lock is being achieved can keep the error from accumulating to too great a value. That helps ensure that full scale requirements are not too high and helps ensure that offset errors related to large full scales are not too great.

In another embodiment, frequency difference information from the PFD 204 may be used to adjust the output of the loop filter 207 using arithmetic circuit 209. Note that the first delta value from the PFD 204 provides a good estimate of the frequency difference between the input clock signal 201 and the feedback signal 203. The arithmetic circuit 209 (shown as a multiplier in the embodiment of FIG. 2) may be used to adjust the output of the loop filter, e.g., with a ramp function corresponding to the initial delta (frequency difference) determined by the PFD. Adjusting the output of the loop filter using a ramp corresponding to the initial frequency difference ensures that a low bandwidth PLL may more quickly achieve lock. In other embodiments, a step function may be utilized instead of a ramp to more quickly allow the PLL to lock.

Thus, responsive to the edge detect, the digital feedback divider is reset and loaded with a divider value to align the edge of the feedback signal with the edge of the input clock. Bringing the input and feedback edges to the same point digitally allows the lock process to go much faster. If input and feedback edges are close at startup, every cycle provides PFD frequency/phase information that can be processed immediately. The PFD frequency/phase information should be acted upon before the information is too old and before the phase difference accumulates to overwhelm the PFD in its full scale region. The initial edge adjustment allows that to occur. Thus, the approach described herein provides substantial phase alignment at startup, no phase impulse to filter downstream, and quick lock because the phase/frequency difference at startup is small.

Figure 4:
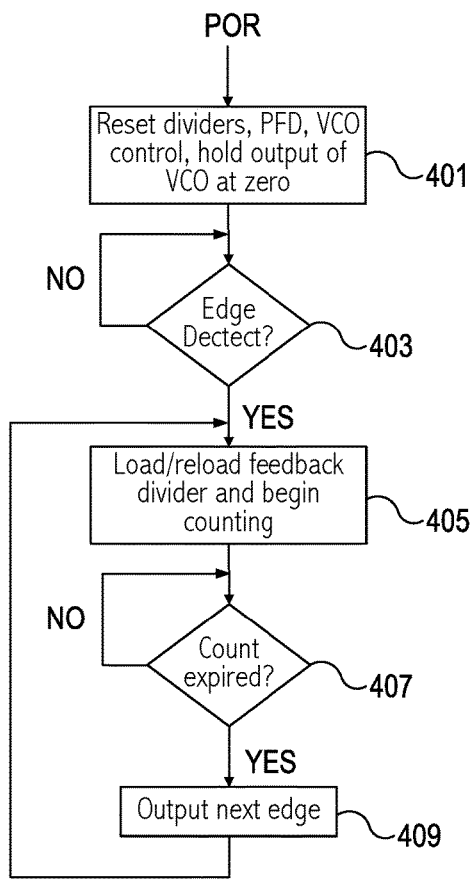
FIG. 4 shows a flow chart of the fast lock operation in a startup scenario.

FIG. 4 illustrates the sequence for a startup operation for an embodiment. At 401, responsive to a POR, all the dividers and the PFD are reset along with any delta value being supplied to the VCO/DCO to adjust it from its center frequency. In addition, the output of the PLL is held at reset. Referring back to FIG. 2, that may be accomplished by setting the HOLD signal supplied to AND gate 231 to zero. At 403, the system waits for a negative (or positive) edge of the input clock to load/start feedback divider. For example, when the negative edge is received, the feedback divider is loaded with a half cycle count and begins counting at 405. When the count value is reached, indicating the end of the half cycle (YES at 407), the feedback signal is released along with the PLL output at AND gate 231 and issues its initial edge at 409. The feedback signal is now close to the input clock signal as their edges are aligned (or close). The feedback divider can now reload at 405. As mentioned earlier, the feedback path can be further adjusted by adjusting the edge of the feedback divider signal for N cycles to help prevent PFD full scale. Continuing to adjust the edge of the feedback signal ensures that the difference of the input clock signal and the feedback signal does not get too large on startup even after the initial correction. Note that such adjustment can result in an I/O discrepancy.

In addition to improving lock on startup, similar techniques can be utilized to improve lock in loss of lock (LOL) or manual switch scenarios to achieve hitless switching (switching of input signals without major disruptions to the output signal). Referring back to FIG. 2, when a loss of lock condition occurs or a manual switch occurs because a different input clock signal is desired the clock signal 241 selects one of the input signals CLKIN1, CLKIN2, CLKINN signals to be supplied by multiplexer 243 as the input clock signal 201. In addition, when a loss of lock or manual switch occurs the digital process and control logic 217 is notified by the control signal 233. That triggers a sequence of events. In response to the edge detect signal after the switch signal 233 is asserted, the digital process and control logic, in conjunction with the feedback divider 219, captures, stores and processes the current feedback divider value as a phase offset between the old input clock signal and the new input clock signal.

Figure 5:
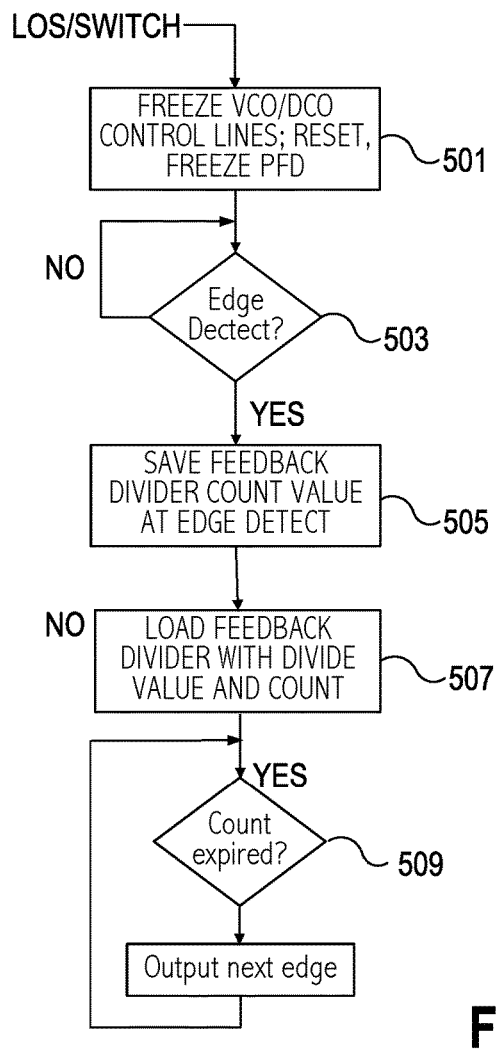
FIG. 5 shows a flow diagram of operation of a switch between input clock signals.

FIG. 5 an example flow diagram of a switching event. When LOS is detected or a manual switch is made, the VCO/DCO control lines are frozen and the PFD is reset and frozen in 501. The system waits for a new input clock edge to detect at 503. When detected, the feedback divider value at edge detect is saved at 505 to capture the phase offset between the new input clock and the old input clock. Next the divider value is reset and loaded with the appropriate feedback divider count value at 507 so when the count expires (YES at 509) the edge of the divider clock aligns with the new input clock as described above and then the PFD can be released. Assuming the input clocks are the same frequency, the divide value (divider count) may be the same value. If the input clocks are different frequencies, the new frequency may be known or determined by counting the number of oscillator clocks between edges of the new clock. Once aligned, the difference between the feedback signal and the new input clock is small so the values supplied by the PFD correspond to small differences between the input signals.

After the initial edge correction, there is still a phase offset between the old input clock and the new input clock represented by the value of the feedback divider at assertion of edge detect after LOS. That value can be utilized by the phase/frequency processing block 251 to gradually adjust the value supplied to the VCO using arithmetic circuit 209. The arithmetic circuit scales the output of the loop filter to gradually align the output clock with the new input clock, e.g., at a rate of 0.01% change per cycle using a ramp or other appropriate function.

Figure 6:
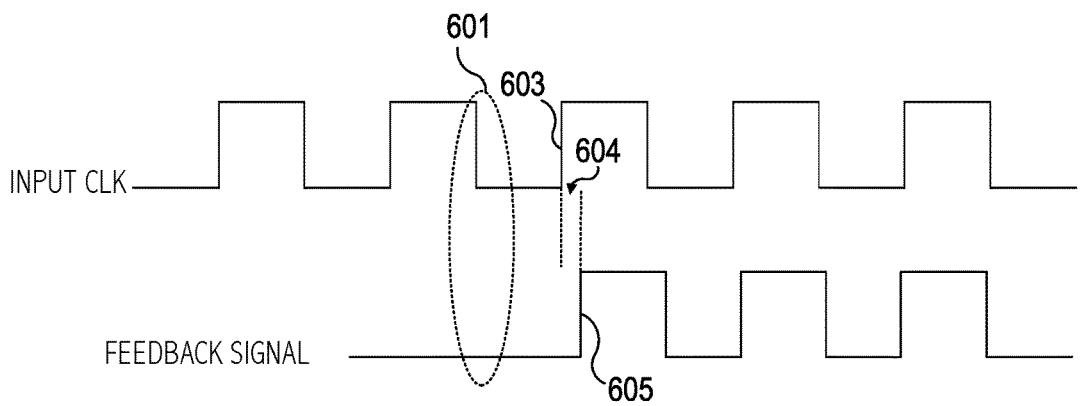
FIG. 6 shows a timing diagram associated with a switch of input clock due to a loss of signal or a manual switch.

Once the PFD is released, both the input clock signal and the feedback signal edges will be very close to each other by design. By reading the PFD output after the switch, the coarse frequency difference can be calculated since the first edges match by architecture. Thus, referring to FIG. 6, after edge 601 is detected edges 603 and 605 match based on the alignment but still have a difference 604 between edges 603 and 605, which represents the coarse frequency difference between the new input clock signal and the feedback signal. Deltas between consecutive edges (gradient and offset information) also provide frequency and phase information that can be corrected on a cycle by cycle basis by the feedback divider, where gradient indicates the rate of change of the difference between the feedback signal and the new input clock signal. Thus, edge correction can continue for a number of cycles.

Thus, various aspects have been described relating to fast lock on startup or switching. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
    detecting a first edge of an input clock signal in an edge detect circuit and generating an edge detect signal based thereon, the input clock signal being supplied to a phase and frequency detector (PFD) of a phase-locked loop;
    generating a feedback signal in a feedback divider responsive to assertion of the edge detect signal, the feedback signal having an initial edge that is substantially aligned with a second edge of the input clock signal;
    supplying the feedback signal to the PFD, with the initial edge substantially aligned with the second edge of the input clock signal; and
    keeping an output path of the phase-locked loop in a reset condition and releasing the output path of the phase-locked loop substantially simultaneously with releasing the feedback divider to supply the feedback signal.

2. The method as recited in claim 1, further comprising determining the initial edge of the feedback signal by setting a length of time that should pass before supplying the feedback signal with the initial edge.

3. The method as recited in claim 2, wherein the length of time is a number of periods of a feedback divider input signal, the feedback divider input signal being coupled to an oscillator of the phase-locked loop.

4. The method, as recited in claim 1, wherein the detecting of the first edge of the input clock signal and the generating of the feedback signal are responsive to a reset condition.

5. The method as recited in claim 4, wherein the feedback signal is maintained in a steady state condition responsive to the reset condition and released from the steady state condition with the initial edge.

6. The method as recited in claim 1, further comprising:
    detecting an additional edge of the input clock signal in the edge detect circuit and generating an additional edge detect signal based thereon;
    tracking a current difference between the feedback signal that is substantially aligned and the input clock signal for at least another cycle using the additional edge detect signal and generating a tracked difference; and
    adjusting the feedback signal based on the tracked difference to reduce the current difference.

7. The method as recited in claim 1, further comprising:
    adjusting phase and frequency information supplied from a loop filter with information based on an initial difference determined by the phase and frequency detector between the initial edge of the feedback signal and the second edge of the input clock signal.

8. The method, as recited in claim 1, further comprising detecting the edge and adjusting the edge responsive to a switch between from using a first input clock signal as the input clock signal to using a second input clock signal as the input clock signal.

9. The method as recited in claim 1, further comprising:
    gating off a logic gate coupled to an output signal of an oscillator of the phase-locked loop using a first value of a control signal to keep the output path of the phase-locked loop in the reset condition and gating on the logic gate using a second value of the control signal to release the output path of the phase-locked loop.

10. A method comprising:
    detecting a first edge of an input clock signal in an edge detect circuit and generating an edge detect signal based thereon, the input clock signal being supplied to a phase and frequency detector (PFD) of a phase-locked loop;
    generating a feedback signal in a feedback divider responsive to assertion of the edge detect signal, the feedback signal having an initial edge that is substantially aligned with a second edge of the input clock signal;
    supplying the feedback signal to the PFD, with the initial edge substantially aligned with the second edge of the input clock signal;
    detecting the edge and adjusting the edge responsive to a switch between from using a first input clock signal as the input clock signal to using a second input clock signal as the input clock signal; and
    storing a value corresponding to a value in the feedback divider in response to detecting the edge, the value corresponding to a difference between the first input clock signal and the second input clock signal.

11. A phase-locked loop comprising:
    a phase and frequency detector coupled to supply a difference between an input clock signal and a feedback signal;
    an edge detect circuit coupled to receive the input clock signal and to provide an edge detect indication responsive to detecting a first edge of the input clock signal;

a feedback divider circuit responsive to the edge detect indication to delay supplying of the feedback signal so as to substantially align an initial edge of the feedback signal with a second edge of the input clock signal when the feedback signal is supplied;

a loop filter; and an arithmetic circuit to adjust information supplied from the loop filter with information based on an output of the phase and frequency detector providing an initial difference between the initial edge of the feedback signal and the second edge of the input clock signal.

12. The phase-locked loop as recited in claim 11, where the feedback divider circuit is configured to generate the initial edge of the feedback signal by counting a divider value that corresponds to alignment of the feedback signal and the input clock signal, thereby determining a length of time to wait before supplying the feedback signal with the initial edge.

13. The phase-locked loop as recited in claim 12, wherein the length of time corresponds to a number of periods of a feedback divider input clock signal coupled to an oscillator of the phase-locked loop.

14. The phase-locked loop as recited in claim 11, wherein the feedback divider circuit is responsive to a reset condition to align the feedback signal and the input clock signal.

15. The phase-locked loop as recited in claim 14, wherein an output path of the phase-locked loop is kept in a reset condition and released substantially simultaneously with supplying the feedback signal with the first edge.

16. The phase-locked loop as recited in claim 11,
wherein the feedback divider circuit is further configured to track differences between the feedback signal and the input clock signal after the feedback signal with the first edge is supplied to the phase and frequency detector responsive to additional assertions of the edge detect and generate tracked differences; and wherein the feedback divider circuit further adjusts respective edges of the feedback signal based on the tracked differences to further align the feedback signal and the input clock signal.

17. The phase-locked loop as recited in claim 11, further comprising:

a selector circuit to select from between at least a first and a second clock signal to provide the input clock signal;

wherein the edge detect circuit is responsive to detect the edge of the input clock signal responsive to a switch in the input clock signal from the first to the second clock signal and supply an edge detect indication.

18. The phase-locked loop as recited in claim 11, further comprising:

a selector circuit to select from between at least a first and a second clock signal to provide the input clock signal;

wherein the edge detect circuit is responsive to detect the edge of the input clock signal responsive to a switch of the input clock signal from the first to the second clock signal and supply the edge detect indication.

19. The phase-locked loop as recited in claim 18, further comprising:

wherein the feedback divider circuit is responsive to store a value of the feedback divider circuit responsive to the edge detect indication, the value of the feedback divider circuit corresponding to a difference between the first and second clock signals.

20. The phase-locked loop as recited in claim 11, wherein a ramp function is used to adjust the information supplied from the loop filter with information based on the output of the phase and frequency detector providing the initial difference between the initial edge of the feedback signal and the second edge of the input clock signal.

* * * * *